United States Patent
Hardy et al.

(10) Patent No.: US 6,238,592 B1
(45) Date of Patent: May 29, 2001

(54) WORKING LIQUIDS AND METHODS FOR MODIFYING STRUCTURED WAFERS SUITED FOR SEMICONDUCTOR FABRICATION

(75) Inventors: L. Charles Hardy, St. Paul; Jennifer L. Trice, Eagan, both of MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/266,208

(22) Filed: Mar. 10, 1999

(51) Int. Cl.$^7$ .................................................. C09K 13/00
(52) U.S. Cl. .................. 252/79.1; 252/79.2; 252/79.5; 438/691; 438/692; 438/693
(58) Field of Search ..................... 252/79.1, 79.2, 252/79.5; 106/3

(56) References Cited

U.S. PATENT DOCUMENTS

| | | | |
|---|---|---|---|
| 3,438,811 | 4/1969 | Harriman et al. | 134/2 |
| 3,499,250 | 3/1970 | Jensen et al. | 51/109 |
| 3,504,457 | 4/1970 | Jacobsen et al. | 51/131 |
| 4,512,113 | 4/1985 | Budinger | 51/236 |
| 4,642,221 | 2/1987 | Hansen et al. | 422/16 |
| 4,879,258 | 11/1989 | Fisher | 437/225 |
| 5,257,478 | 11/1993 | Hyde et al. | 51/131.3 |
| 5,489,233 | 2/1996 | Cook et al. | 451/41 |
| 5,575,885 * | 11/1996 | Hirabayashi et al. | 156/626.1 |
| 5,578,362 * | 11/1996 | Reinhardt et al. | 428/147 |
| 5,700,095 * | 12/1997 | Sasaki et al. | 216/38 |
| 5,700,383 * | 12/1997 | Feller et al. | 216/88 |
| 5,709,588 | 1/1998 | Muroyama | 451/41 |
| 5,827,637 * | 10/1998 | Uchida et al. | 430/505 |
| 5,897,375 * | 4/1999 | Watts et al. | 438/693 |

FOREIGN PATENT DOCUMENTS

| | | | |
|---|---|---|---|
| 0 747 939 A2 | 12/1996 | (EP) | H01L/21/321 |
| 0846742 | 6/1998 | (EP) | C09G/1/02 |
| 0896042 | 2/1999 | (EP) | C09G/1/02 |

OTHER PUBLICATIONS

Cotton & Wilkinson; and Hathaway in *Comprehensive Coordination Chemistry*, vol. 5; Wilkinson, Gillard, McCleverty, Eds., pp. 533, 534, 683, 743, and 744.

* cited by examiner

Primary Examiner—Robert Kunemund
Assistant Examiner—Charlotte A. Brown
(74) Attorney, Agent, or Firm—Colene H. Blank (57) ABSTRACT

A family of working liquids useful in modifying exposed surfaces of wafers for semiconductor fabrication are provided along with methods of modifying exposed surfaces of wafers for semiconductor fabrication utilizing such a family of working liquids, and semiconductor wafers made according the foregoing process. The working liquid of the invention is a solution of initial components, the components comprising: an oxidizing agent; an ionic buffer; a passivating agent; a chelating agent selected from iminodiacetic acid and salts thereof; and water. The method of the invention comprises the steps of: a) providing a wafer comprising a first material having a surface etched to form a pattern and a second material deployed over the surface of the first material; b) contacting the second material of the wafer with abrasive in the presence of the working liquid; and c) relatively moving the wafer while the second material is in contact with the abrasive until an exposed surface of the wafer is planar and comprises at least one area of exposed first material and one area of exposed second material.

18 Claims, 2 Drawing Sheets

WORKING LIQUIDS AND METHODS FOR MODIFYING STRUCTURED WAFERS SUITED FOR SEMICONDUCTOR FABRICATION

BACKGROUND

The present invention relates to a family of working liquids useful in modifying exposed intermediate surfaces of structured wafers for semiconductor fabrication, to methods of modifying exposed intermediate surfaces of structured wafers for semiconductor fabrication utilizing such a family of working liquids, and to semiconductor wafers made according the foregoing process.

During integrated circuit manufacture, semiconductor wafers used in semiconductor fabrication typically undergo numerous processing steps, including deposition, patterning, and etching steps. Details of these manufacturing steps for semiconductor wafers are reported by Tonshoff et al., "Abrasive Machining of Silicon", published in the *Annals of the International Institution for Production Engineering Research*, (Volume 39/2/1990), pp. 621–635. In each manufacturing step, it is often necessary or desirable to modify or refine an exposed surface of the wafer in order to prepare the wafer for subsequent fabrication or manufacturing steps.

In conventional semiconductor device fabrication schemes, a flat, base silicon wafer is subjected to a series of processing steps that deposit uniform layers of two or more discrete materials which together form a single layer of what will become a multilayer structure. In this process, it is common to apply a uniform layer of a first material to the wafer itself or to an existing layer of an intermediate construct by any of the means commonly employed in the art, to etch pits into or through that layer, and then to fill the pits with a second material. Alternatively, features of approximately uniform thickness comprising a first material may be deposited onto the wafer, or onto a previously fabricated layer of the wafer, usually through a mask, and then the regions adjacent to those features may be filled with a second material to complete the layer. Following the deposition step, the deposited material or layer on a wafer surface generally needs further processing before additional deposition or subsequent processing occurs. When completed, the outer surface is substantially globally planar and parallel to the base silicon wafer surface. A specific example of such a process is the metal Damascene processes.

In the Damascene process, a pattern is etched into an oxide dielectric (e.g., silicon dioxide) layer. After etching, optional adhesion/barrier layers are deposited over the entire surface. Typical barrier layers may comprise tantalum, tantalum nitride, titanium nitride or titanium, for example. Next, a metal (e.g., copper) is deposited over or on top of the adhesion/barrier layers. The deposited metal layer is then modified, refined or finished by removing the deposited metal and regions of the adhesion/barrier layer on the surface of the dielectric. Typically, enough surface metal is removed so that the outer exposed surface of the wafer comprises both metal and an oxide dielectric material. A top view of the exposed wafer surface would reveal a planar surface with metal corresponding to the etched pattern and dielectric material adjacent to the metal. The metal(s) and oxide dielectric material(s) located on the modified surface of the wafer inherently have different physical characteristics, such as different hardness values. The abrasive treatment used to modify a wafer produced by the Damascene process must be designed to simultaneously modify the metal and dielectric materials without scratching the surface of either material. The abrasive treatment must create a planar outer exposed surface on a wafer having an exposed area of a metal and an exposed area of a dielectric material.

Such a process of modifying the deposited metal layer until the oxide dielectric material is exposed on the wafer outer surface leaves little margin for error because of the submicron dimensions of the metal features located on the wafer surface. The removal rate of the deposited metal should be relatively fast to minimize manufacturing costs, and the metal must be completely removed from the areas that were not etched. The metal remaining in the etched areas must be limited to discrete areas or zones while being continuous within those areas or zones to ensure proper conductivity. In short, the metal modification process must be uniform, controlled, and reproducible on a submicron scale.

One conventional method of modifying or refining exposed surfaces of structured wafers employs methods that treat a wafer surface with a slurry containing a plurality of loose abrasive particles dispersed in a liquid. Typically this slurry is applied to a polishing pad and the wafer surface is then ground or moved against the pad in order to remove material from the wafer surface. Generally, the slurry may also contain chemical agents that react with the wafer surface. This type of process is commonly referred to as a chemical-mechanical planarization (CMP) process.

A recent alternative to CMP slurry methods uses an abrasive article to modify or refine a semiconductor surface and thereby eliminate the need for the foregoing slurries. This alternative CMP process is reported in International Publication No. WO 97/11484, published Mar. 27, 1997. The reported abrasive article has a textured abrasive surface which includes abrasive particles dispersed in a binder. In use, the abrasive article is contacted with a semiconductor wafer surface, often in the presence of a working liquid, with a motion adapted to modify a single layer of material on the wafer and provide a planar, uniform wafer surface. The working liquid is applied to the surface of the wafer to chemically modify or otherwise facilitate the removal of a material from the surface of the wafer under the action of the abrasive article.

Working liquids useful in the process described above, either in conjunction with the aforementioned slurries or the abrasive articles, are typically aqueous solutions of a variety of additives including complexing agents, oxidizing agents, passivating agents, surfactants, wetting agents, buffers, rust inhibitors, lubricants, soaps, or combinations of these additives. Additives may also include agents which are reactive with the second material, e.g., metal or metal alloy conductors on the wafer surface such as oxidizing, reducing, passivating, or complexing agents. Examples of such working liquids may be found, for example, in U.S. patent application Ser. No. 09/091,932 filed Jun. 24, 1998.

In the CMP processes mentioned above, dishing performance and removal rate are measurements of polishing performance. These performance measurements may depend on the use of the foregoing working liquids. Dishing is a measure of how much metal, such as copper, is removed from bond pads or wire traces below the plane of the intermediate wafer surface as defined by the difference in height between the copper and the tops of the barrier or dielectric layers following removal of the blanket copper or copper plus barrier layer. Removal rate refers to the amount of material removed per unit time. Removal rates greater than at least about 1000 Å per minute are preferred. Lower removal rates, such as a few hundred angstroms per minute (Å/min) or less, are less desirable because they tend to create increases in the overall manufacturing costs associated with wafer manufacture.

It is desirable to provide improvements in chemical mechanical planarization by providing working liquids useful in modifying exposed intermediate surfaces of structured wafers for semiconductor fabrication and to methods of modifying the exposed intermediate surfaces of such wafers for semiconductor fabrication, preferably with improved, sustainable, metal removal rates and utilizing the foregoing family of working liquids. It is especially desirable to provide working liquids that are useful in the aforementioned methods and resulting in the fabrication of metal containing structured wafers with improved dishing characteristics.

SUMMARY OF THE INVENTION

The invention provides a family of working liquids for use in modifying or refining intermediate surfaces of structured wafers suited for semiconductor fabrication. The invention also provides methods for utilizing such working liquids to modify the intermediate surfaces of such wafers. As used herein, an intermediate surface of a structured wafer typically includes a first material with a surface etched to form a pattern or a design and a second material deployed over the surface of the first material.

In one aspect, the invention provides a working liquid useful in modifying a surface of a wafer suited for fabrication of a semiconductor device, the liquid being solution of initial components, the components comprising:

an oxidizing agent;

an ionic buffer;

a passivating agent;

a chelating agent selected from iminodiacetic acid and salts thereof; and water.

The passivating agent of the working liquid may be an azole derivative, preferably selected from benzotriazole, tolyltriazole or combinations thereof. Preferably, the working liquid includes hydrogen peroxide as an oxidizing agent, ammonium hydrogen phosphate as the ionic buffer, and tolyltriazole, as passivating agent.

In referring to aspects of the invention, certain terms will be understood to have the following meanings:

"Dishing" is the deviation of the center of a feature from the plane defined by the edges of the feature. For testing purposes, either 100 or 120 micron square bond pads are commonly used in measuring dishing after overlying second material (e.g., copper) is removed during the CMP process from the first material (e.g., dielectric material) to leave areas of second material only in defined discrete areas such as etched areas within the dielectric first material. Unless otherwise indicated herein, dishing measurements refer to dishing on areas of second material, typically areas comprised of copper. As used herein, dishing is reported as "TIR" or "Total Indicated Runout," which is a measure of the flatness of a structured wafer in a specified region of the wafer. The TIR value is typically measured along a line in a specified area of the semiconductor wafer using an instrument such as a TENCOR P-22 Long Scan Profilometer, available from TENCOR of Mountain View, Calif. The measure represents the distance between two imaginary parallel planes, one that intersects or touches the highest point of the surface of a semiconductor wafer and the other that intersects or touches the lowest point of the surface of the semiconductor wafer in the area of consideration.

"Uniformity" is a measure of how uniform the removal rate of copper is across the surface of the wafer.

"Removal Rate" is the rate at which metal film is removed from a wafer, i.e., the thickness removed per unit time. Removal rate is measured by subtracting the final copper thickness from the initial copper thickness at the different points on the wafer. The standard deviation of differences divided by the mean of the differences is reported as % uniformity. A low number for uniformity (e.g., 2 to 3%) is preferred.

A "three-dimensional" abrasive article is an abrasive article having numerous abrasive particles extending throughout at least a portion of its thickness such that removing some of the particles during planarization exposes additional abrasive particles capable of performing the planarization function.

In another aspect, the invention provides a method of modifying a surface of a wafer suited for fabrication of a semiconductor device comprising the steps of:

a) providing a wafer comprising a first material having a surface etched to form a pattern and a second material deployed over the surface of the first material;

b) contacting the second material of the wafer with abrasive in the presence of the aforementioned working liquid; and c) relatively moving the wafer while the second material is in contact with the abrasive until an exposed surface of the wafer is planar and comprises at least one area of exposed first material and one area of exposed second material.

In this aspect, the working liquid is as described above. The abrasive comprises an article, and the movement between the wafer and abrasive article occurs under pressure in the general range from about 0.1 to about 25 psi, preferably under in a range from about 0.2 to about 15 psi and most preferably in a range from about 1 to about 6 psi. The wafer and abrasive article may be rotated and/or moved against each other in a circular fashion, spiral fashion, a non-uniform manner, elliptical fashion as a figure eight or a random motion fashion. The wafer holder or the base may also oscillate or vibrate, such as by transmitting ultrasonic vibrations through the holder or base. For example, either the abrasive article or the wafer or both the abrasive article and the wafer are rotated relative to the other as well as being moved linearly along relative centers of the wafer and abrasive article. The rotational motion or speed of rotation between the wafer and abrasive article may be between 1 rpm to 10,000 rpm. Preferred rotational speeds for the abrasive article are when the abrasive article rotates at a speed between 10 rpm to 1,000 rpm, and more preferably between 10 rpm to 250 rpm and most preferably between 10 rpm to 60 rpm. Preferred rotational speeds for the wafer are when the wafer rotates at a speed between 2 rpm to 1,000 rpm, more preferably between 5 rpm to 500 rpm, and still more preferred between 10 rpm to 100 rpm.

A preferred abrasive used in the foregoing method comprises three-dimensional abrasive composites fixed to an abrasive article, the composites comprising a plurality of abrasive particles fixed and dispersed in a binder. It is preferred that the abrasive article further comprises a backing and more preferably this backing is a polymeric film. This backing will have a front surface and a back surface. The backing may be selected from a group of materials which have been used for abrasive articles such as paper, nonwovens, cloth, treated cloth, polymeric film, and primed polymeric film. In a preferred embodiment, the backing is a primed polyester film. Additionally, such an abrasive may be secured to or otherwise supported by a subpad comprised of a laminate of a polycarbonate sheet and polyurethane foam. The subpad will typically have a front surface and a back surface and the abrasive may be present over the front surface of the subpad. A pressure sensitive adhesive may be applied on the back surface of the backing of the abrasive in order to fix the abrasive article to the subpad.

Alternatively, the abrasive may comprise an abrasive or polishing slurry used in conjunction with a polishing pad, the slurry comprising a plurality of loose abrasive particles dispersed in a liquid (e.g., water) with the slurry contacting the second material of the wafer by the application of the polishing pad. If a slurry and a polishing pad are used as the abrasive, the slurry will preferably include the aforementioned working liquid as a part thereof.

The method is preferably directed to modifying intermediate surfaces of a structured wafer. The first material is typically a dielectric material with an intermediate material or adhesion/barrier layer applied thereover. Some suitable intermediate materials or adhesion/barrier layers include tantalum, titanium, tantalum nitride, titanium nitride. Other suitable intermediate materials or adhesion/barrier layers include metals, nitrides, and silicides. The designs associated with the first material include patterned areas, grooved areas, and vias, as well as other structures which make up a completed semiconductor device. The second material is typically a conductive material selected from titanium, silver, aluminum, tungsten, copper, or alloys thereof. The present method is particularly adapted to modifying conductive surfaces of materials having resistivity values typically less than about 0.1 ohm-cm. In general, preferred dielectric materials will have dielectric constants less than about 5.

In the method, contact and motion is maintained between the abrasive and the conductive material until an exposed surface of the wafer is planar and comprises at least one area of exposed second or conductive material and at least one area of exposed first or dielectric material, and the exposed area of conductive material and the exposed area of dielectric material lay in a single plane. The dielectric material may be covered by one or more intermediate materials such as an adhesion/barrier layer. Typically, the exposed dielectric material surface is essentially free of the intermediate material after removal of the excess conductive material. Alternatively, removal of the conductive material may expose only the surfaces of the intermediate material and the conductive material. Continued modification may then expose on the surface of the wafer the dielectric material and the conductive material.

These and other aspects of the invention will be understood by those skilled in the art after consideration of the remainder of the disclosure including the Detailed Description Of The Preferred Embodiment and the appended claims.

DETAILED DESCRIPTION OF THE PREFERRED EMBODIMENT

The invention will be described by reference to its preferred embodiment. In this detailed description, reference will be made to the various figures where certain features are identified by reference numerals and wherein like numerals indicate like features.

Figure 1:
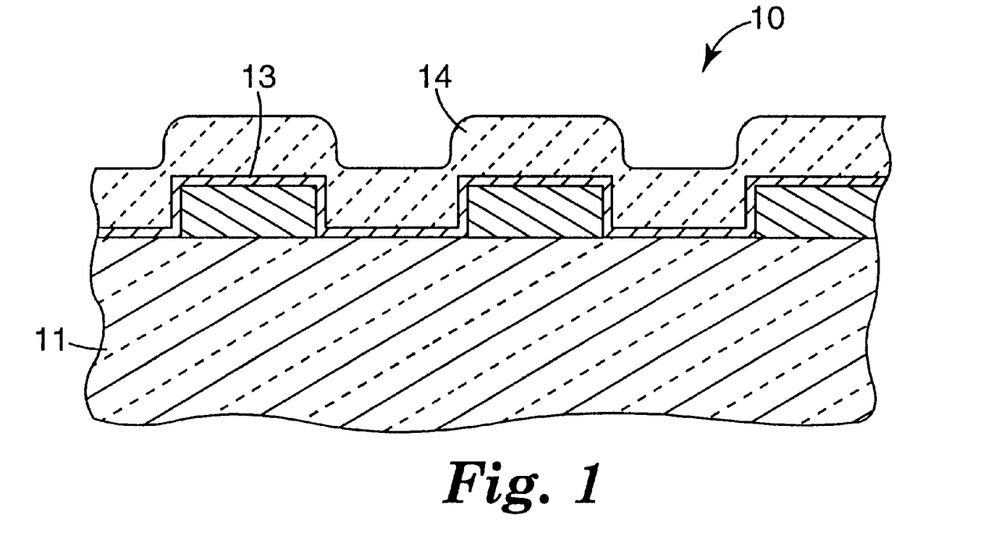
FIG. 1 is a schematic cross sectional view of a portion of a structured wafer before surface modification.

FIG. 1 is a representative view of a patterned wafer 10 suitable for use in the process of the invention. For clarity, known features such as doped regions, active devices, epitaxial layers, carrier and field oxide layers have been omitted. Wafer 10 has a base 11 and a plurality of topographical features, typically made from any appropriate material such as single crystal silicon, gallium arsenide, and other materials known in the art. A barrier or adhesion layer 13, typically titanium nitride, titanium, tantalum, tantalum nitride or silicon nitride covers the base layer 11 and base features.

Figure 2:
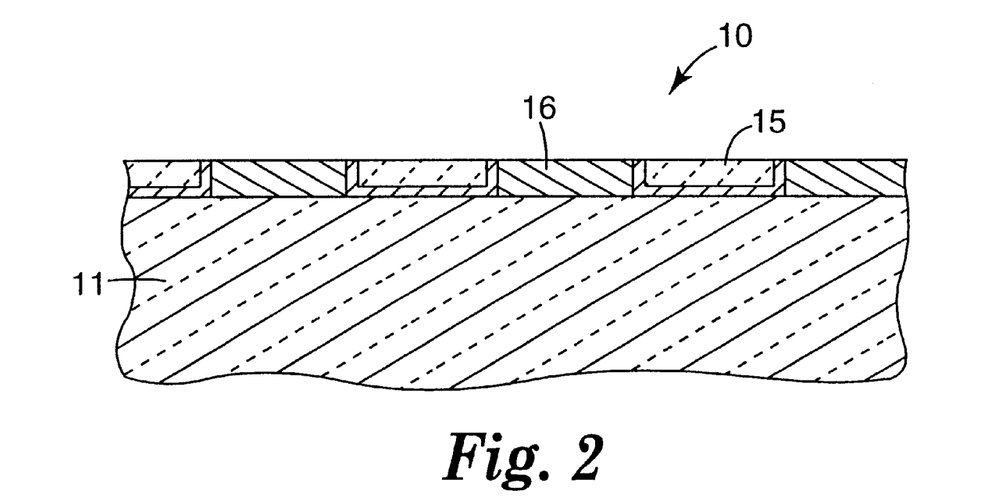
FIG. 2 is a schematic cross sectional view of a portion of a structured wafer after surface modification.

A metal conductor layer 14 covers the front surface of barrier layer 13 and base features. A variety of metal or metal alloys may be used such as titanium, aluminum, copper, aluminum copper alloy, tungsten, or silver. The metal layer is typically applied by depositing a continuous layer of the metal on barrier layer 13. Excess metal is then removed to form the desired pattern of metal interconnects 15 illustrated in FIG. 2. Metal removal provides discrete metal interconnect surfaces 15 and discrete feature surfaces 16 that preferably provide a planar surface free of scratches or other defects that could interfere with the operability of the finished semiconductor device.

Figure 3:
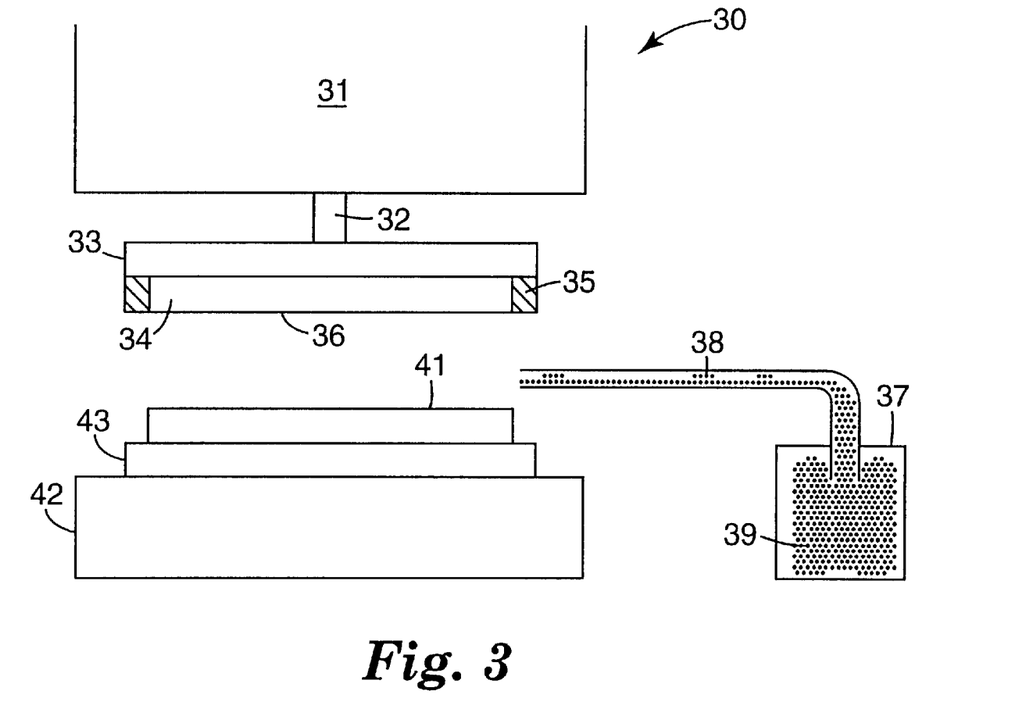
FIG. 3 is a partial side schematic view of one apparatus for modifying the surface of a wafer used in semiconductor fabrication.

FIG. 3 schematically illustrates an apparatus for modifying wafers and useful in the process of the invention. Variations of this machine and/or numerous other machines may be useful with this invention. This type of apparatus and numerous variations and other types of apparatus are known in the art for use with polishing pads and loose abrasive slurries. An example of a suitable, commercially available apparatus is a CMP (chemical mechanical process) machine available from IPEC/WESTECH of Phoenix, Ariz. Alternative CMP machines are available from STRASBAUGH or SPEEDFAM. The apparatus 30 comprises head unit 31 connected to a motor (not shown). Chuck 32 extends from head unit 31; an example of such a chuck is a gimbal chuck. The design of chuck 32 preferably accommodates different forces and pivots so that the abrasive article provides the desired surface finish and flatness on the wafer. However, the chuck may or may not allow the wafer to pivot during planarization.

At the end of chuck 31 is wafer holder 33 securing wafer 34 to head unit 31 and preventing the wafer from becoming dislodged during processing. The wafer holder is designed to accommodate the wafer and may be, for example, circular, oval, rectangular, square, octagonal, hexagonal, or pentagonal. In some instances, the wafer holder includes two parts, an optional retaining ring and a wafer support pad. The retaining ring may be a generally circular device that fits around the periphery of the semiconductor wafer. The wafer support pad may be fabricated from one or more elements, e.g., polyurethane foam. Wafer holder 33 extends alongside of semiconductor wafer 34 at ring portion 35. The optional ring portion may be a separate piece or may be integral with holder 33. In some instances, wafer holder 33 will not extend beyond wafer 34 such that wafer holder 33 does not touch or contact abrasive article 41. In other instances, wafer holder 33 does extend beyond wafer 34 such that the wafer holder does touch or contact the abrasive composite, in which case the wafer holder may influence the characteristics of the abrasive composite. For example, wafer holder 33 may "condition" the abrasive article and remove the outermost portion of the surface of the abrasive article during processing. The wafer holder or retaining ring may be of any design or material which will allow the abrasive article to impart the desired degree of modification to the wafer. Examples of suitable materials include polymeric materials.

The speed at which wafer holder 33 rotates will depend on the particular apparatus, processing conditions, abrasive article, and the desired wafer modification criteria. In general, however, wafer holder 33 rotates between about 2 to about 1,000 rpm, typically between about 5 to about 500 rpm, preferably between about 10 to about 300 rpm and more preferably between about 20 to about 100 rpm. If the wafer holder rotates too slowly or too fast, then the desired removal rate may not be achieved.

Wafer holder 33 and/or base 42 may rotate in a circular fashion, spiral fashion, a non-uniform manner, elliptical fashion as a figure eight or a random motion fashion. The wafer holder or base may also oscillate or vibrate, such as by transmitting ultrasonic vibrations through the holder or base.

As mentioned, the abrasive used in the present invention will typically be a pad used in combination with an abrasive slurry or it will be a three dimensional abrasive article of the type generally described in U.S. Pat. No. 5,692,950 issued to Bruxvoort et al. on Dec. 2, 1997, and entitled "Abrasive Construction For Semiconductor Wafer Modification," the disclosure of which is incorporated by reference herein.

As used herein, "article" or "abrasive article" will be understood to refer to either a polishing pad for use in combination with an abrasive slurry or a three dimensional shaped abrasive article. Preferably, the abrasive will be a three dimensional shaped abrasive article. The article will have a diameter between about 10 to 1000 mm, preferably between about 25 to 850 mm. The article may rotate between about 5 to 10,000 rpm, typically between about 10 to 1,000, between about 10 to 250 rpm and preferably between 10 rpm to 60 rpm. It is preferred that both the wafer and the article rotate in the same direction. However, the wafer and the article may also rotate in opposite directions.

The interface between the wafer surface 34 and wafer holder 33 preferably should be relatively flat and uniform to ensure that the desired degree of planarization is achieved. Working liquid 39 is held within reservoir 37 and pumped through tubing 38 to the interface between wafer surface and article 41. It is preferred that during planarization there be a constant flow of the working liquid to the interface between the article and the wafer surface. Typically, the working liquid is first applied to the outer or exposed wafer surface 34 and allowed to react with at least one of the materials on that surface. Subsequently, the abrasive is applied to the surface of the wafer to remove the reaction product of the wafer material and the working liquid. Alternatively, the metal may first be removed mechanically and then reacted with ingredients in the working fluid. The flow rate of the working liquid may depend in part upon the desired planarization criteria (removal rate, surface finish and planarity), the particular wafer construction, the exposed metal chemistry and the surface configuration of the abrasive article. The flow rate for dispersing the working liquid typically ranges from about 10 to 1,000 milliliters/minute, preferably 10 to 500 milliliters/minute, and more preferably between about 25 to 250 milliliters/minute.

The working liquid of the present invention is useful in the CMP processing of metal containing intermediate surfaces of structured wafers, and especially in the CMP process for copper containing surfaces. The working liquid is an aqueous solution that includes a chemical etchant such as an oxidizing agent to react with the copper to form a surface layer of copper oxides. The oxide layer may then be easily removed from the surface of the wafer by the application of the abrasive. In addition to oxidizing agents, useful chemical etchants include complexing agents that may function in a manner similar to the aforementioned oxidizing agents to create a layer more readily removed by the mechanical action of the abrasive. Suitable chemical etchants include sulfuric acid; hydrogen peroxide; cupric chloride; persulfates of ammonium, sodium and potassium; ferric chloride; chromic-sulfuric acids; potassium ferricyanide; nitric acid, and combinations thereof. Examples of suitable complexing agents include alkaline ammonia such as ammonium hydroxide with ammonium chloride and other ammonium salts and additives, ammonium carbonate, ferric nitrate, and combinations thereof. Numerous additives can be added for stability, surface treatment, or etch rate modifiers. Etchants typically provide an isotropic etch; i.e., the same etch rate or removal rate in all directions.

Suitable oxidizing, or bleaching agents that may be incorporated into a working fluid include transition metal complexes such as ferricyanide, ammonium ferric EDTA, ammonium ferric citrate, ferric citrate, ammonium ferric oxalate, cupric citrate, cupric oxalate, cupric gluconate, cupric glycinate, cupric tartrate, and the like where the complexing agent is typically a multidentate amine, carboxylic acid, or combination of the two. Numerous coordination compounds are described in Cotton & Wilkinson, *Advanced Inorganic Chemistry*, $5^{th}$ Ed. Those with oxidizing potentials suitable for the oxidation of copper metal and/or cuprous oxide could be used, such as coordination compounds including vanadium, chromium, manganese, cobalt, molybdenum, and tungsten. Other suitable oxidizing agents include oxo acids of the halogens and their salts, such as the alkali metal salts. These acids are described in Cotton & Wilkinson, *Advanced Inorganic Chemistry*, $5^{th}$ Ed. The anions of these acids typically contain halide atoms such as: chlorine, bromine, or iodine. These halides are bonded to one, two, three, or four oxygen atoms. Examples include: chloric acid ($HOClO2$); chlorous acid ($HOClO$); hypochlorous acid ($HOCl$); and the respective sodium salts thereof. For example, sodium chlorate, sodium chlorite, and sodium hypochlorite. Similar bromine and iodine analogs are known.

For processing an intermediate surface of a structured wafer containing copper, the preferred oxidizing agents include nitric acid, potassium ferricyanide and, most preferably, hydrogen peroxide is most preferred. Other suitable oxidizing agents are listed in West et al., *Copper and Its Alloys*, (1982), and in Leidheiser, *The Corrosion of Copper, Tin, and Their Alloys*, (1971). The concentration of the oxidizing agent in deionized water may range from about 0.01 to 50% by weight, preferably 0.02 to 40% by weight. Where hydrogen peroxide is used as the oxidizing agent, it is typically present in an aqueous solution at a concentration (weight percentage) within the range from about 0.5% to about 12.5%, preferably from about 1.0% to about 7.5% and most preferably from about 1.0% to about 5.0%.

The oxidation and dissolution of copper is enhanced by the addition of complexing agents that bond to copper to increase the solubility of copper metal or copper oxides in water as generally described in Cotton & Wilkinson; and Hathaway in *Comprehensive Coordination Chemistry*, *Vol. 5*; Wilkinson, Gillard, McCleverty, Eds. In the working liquids of the present invention, complexing agent is always present at a concentration in deionized water from about 0.01 to 50% by weight. In the processing of intermediate surfaces of structured wafers containing copper, the preferred complexing agent is iminodiacetic acid (IDA) and salts thereof, IDA is typically present within the working liquid at a concentration (weight percentage) within the range between about 0.5% and about 5.0%, preferably between about 0.5% and about 2.0% and most preferably between about 0.75% and about 1.5%.

Corrosion inhibitors or passivating agents for metals are well known, especially for steel and galvanized steel. The best known and most widely used inhibitors for copper are benzotriazole and its derivatives known as azole derivatives. Copper is known to be somewhat passivated by cuprous oxide, especially at neutral or mildly alkaline pH. The addition of passivating agent to the working liquid may protect areas of a metal surface not yet in contact with the abrasive article from premature, excessive removal by an etchant or control how much oxidizing agent reacts with the exposed metal surface. Other passivating agents are listed in leidheiser, *The Corrosion of Copper, Tin, and Their Alloys*, (1971), pp. 119–123. The amount and type of passivating agent will depend in part of the desired planarization criteria (removal rate, surface finish and planarity).

In the processing of copper containing wafers according to the present invention, suitable passivating agents include certain azole derivatives, preferably tolyltriazole, benzotriazole and combinations of tolyltriazole and benzotriazole at a concentration in the working liquid (weight percentage) within the range between about 0.025% and about 0.20%, preferably between about 0.050% and about 0.15% and more preferably between about 0.050% and about 0.10%.

Buffers may be added to the working liquid to control the pH and thus mitigate pH changes caused by minor dilution from rinse water and/or the difference in the pH of the deionized water depending on the source. As mentioned above, the pH can have a significant effect on the nature of the copper surface, and the copper removal rate. The most preferred buffers are compatible with semiconductor, post-CMP cleaning needs as well as having reduced potential impurities such as alkali metals. In addition, the most preferred buffers can be adjusted to span the pH range from acidic to near-neutral to basic. Polyprotic acids act as buffers, and when fully or partially neutralized with ammonium hydroxide to make ammonium salts, they are preferred. Representative examples including systems of phosphoric acid-ammonium phosphate; ammonium hydrogen phosphate; polyphosphoric acid-ammonium polyphosphate; boric acid-ammonium tetraborate; boric acid-ammonium pentaborate. Other tri- and polyprotic protolytes and their salts, especially ammonium salts are preferred. These may include ammonium ion buffer systems based on the following protolytes, all of which have at least one pKa greater than 7: aspartic acid, glutamic acid, histidine, lysine, arginine, ornithine, cysteine, tyrosine, and carnosine.

The working liquid may also contain additives such as surfactants, viscosity modifiers, wetting agents, buffers, rust inhibitors, lubricants, soaps, and the like. These additives are chosen to provide the desired benefit without damaging the underlying semiconductor wafer surface. A lubricant, for example, may be included in the working liquid for the purpose of reducing friction between the abrasive article and the semiconductor wafer surface during planarization.

Inorganic particulates may also be included in the working liquid. These inorganic particulates may be used to increase the removal rate of the metal and/or the dielectric. Examples of such inorganic particulates include: silica, zirconia, calcium carbonate, chromia, ceria, cerium salts (e.g., cerium nitrate), garnet, silicates and titanium dioxide. The average particle size of these inorganic particulates should be less than about 1,000 Angstroms, preferably less than about 500 Angstroms and more preferably less than about 250 Angstroms. Although particulates may be added to the working liquid, CMP processes utilizing the foregoing three-dimensional abrasive composites fixed to an abrasive article will preferably employ working liquids substantially free of inorganic particulates, e.g., loose abrasive particles which are not associated with the abrasive article. Preferably, the working liquid contains less than 1% by weight, preferably less than 0.1% by weight and more preferably 0% by weight inorganic particulates. A particularly preferred working liquid effective in the removal of copper from intermediate surfaces of structured wafers comprises a chelating agent, an oxidizing agent, an ionic buffer, and a passivating agent. The preferred working liquid may comprise (by weight percent): hydrogen peroxide at a concentration between about 0.5% and about 12.5%, preferably between about 1.0% and about 7.5%, more preferably between about 1.0% and about 5.0%, and most preferably about 3.3%; Ammonium hydrogen phosphate at a concentration between about 1.0% and about 8.0%, preferably between about 2.0% and about 6.0%, more preferably between about 2.0% and about 4.0%, and most preferably about 3.0%; Iminodiacetic acid at a concentration between about 0.5% and about 5.0%, preferably between about 0.5% and about 2.0%, more preferably between about 0.75% and about 1.5%, and most preferably about 1.0%; tolyltriazole at a concentration typically between about 0.025% and about 0.2%, preferably between about 0.05% and about 0.15%, and most preferably about 0.05%; and the balance (92.65%) water. Those skilled in the art will appreciate that surfactants, viscosity modifiers and other known additives may be added to the working liquid as may be required in a particular application.

The amount of the working liquid applied to the wafer surface is preferably sufficient to aid in the removal of metal or metal oxide deposits from the surface. In many instances, there is sufficient liquid from the basic working liquid and/or the chemical etchant. It will also be appreciated that some polishing applications may require that a second liquid is present at the planarization interface in addition to the first working liquid. This second liquid may be the same as the first liquid, or it may be different.

The working liquids of the invention maybe also used in conventional polishing slurries. As is known to those skilled in the art, such slurries typically comprise one or more types of polishing particulates in a liquid medium, typically water. The particulates may comprise one or more of silica, alumina, zirconia and ceria at a concentration of the abrasive in the slurry between about 2% and about 10% by weight of the total particles in the liquid. If the working liquids of the invention are included in a slurry, the foregoing individual components are preferably present within the liquid portion of slurry at the weight percentages previously indicated . A minor amount of a dispersing agent or surfactant is preferably included in the slurry to aid in dispersing the abrasive particulates throughout the working liquid to form a stable slurry. Dispersing agents and surfactants are well known in the art and the selection of a particular dispersing agent or surfactant will depend on the selection of the abrasive particulate and its properties. Dispersing agents are generally disclosed in, for example, Kirk-Othmer, *Encyclopedia of Chemical Technology*, $4^{th}$ *Edition*, vol. 8 (John Wiley and Sons) (1993). Surfactants that may be suited for use in the invention are disclosed in Kirk-Othmer, *Encyclopedia of Chemical Technology*, $4^{th}$ *Edition*, vol. 23 (John Wiley and Sons) (1997). The remainder of the slurry typically comprises water.

The working liquids of the invention provide improved polishing characteristics by providing reduced dishing for copper surfaces and possibly for other metals as well. Specifically, intermediate wafer surfaces containing copper and treated with the working liquids of the present invention show dishing in the copper areas less than about 1000 Å. Additionally, CMP processes utilizing the working liquids of the invention are characterized, in part, by high removal rates, typically greater than about 1000 Å per minute. These high removal rates are generally present when the working liquid includes both IDA as a chelating agent in combination with tolyltriazole is as the passivating agent. In a particularly preferred embodiment, the working liquid includes IDA and tolyltriazole, which appear to act in a synergistic manner, to provide a working liquid that removes copper from surfaces of the structured wafer with both low dishing and high removal rates.

Where the abrasive article 41 is a three dimensional shaped abrasive article, the article 41 is typically secured to a subpad 43 for support of the abrasive article. In part, the subpad provides rigidity to allow the abrasive article to effectively abrade the exposed wafer surface as well as allowing the abrasive article to conform to the exposed wafer surface. The choice of the particular subpad (i.e., the physical properties of the subpad) is within the skill of those practicing in the field. Subpad constructions are further described in, for example, U.S. patent application Ser. No. 09/091,932, the disclosure of which is incorporated by reference herein. Further details on the construction of the aforementioned three dimensional shaped abrasive article can also be found in the '932 application as well as in U.S. Pat. No. 5,692,950 issued to Bruxvoort et al. on Dec. 2, 1997, and entitled "Abrasive Construction For Semiconductor Wafer Modification."

Methods directed toward producing uniform wear rates across the surface of the object being polished and or across the surface of the polishing pad are discussed in U.S. Pat. Nos. 5,20,283; 5,177,908; 5,234,867; 5,297,364; 5,486,129; 5,230,184; 5,245,790; and 5,562,530. These methods may be adapted for use in the present invention. Variations of the wafer planarization process which employ either a continuous belt or a supply roll of sheet pad material in conjunction with a slurry may also be employed by substituting a belt or roll of textured, three-dimensional abrasive composite and working fluid. Polishing related art such as the structure of the wafer carrier and the wafer support/attachment means which do not inherently depend on an interaction with a particular abrasive surface may be used with the abrasive article comprising textured, three-dimensional abrasive composites of this invention.

Variables that may affect wafer processing include the selection of the appropriate contact pressure between the wafer surface and abrasive article, type of liquid medium, relative speed and relative motion between the wafer surface and the abrasive article, and the flow rate of the liquid medium. These variables are interdependent, and are selected based upon the individual wafer surface being processed.

In general, since there can be numerous process steps for a single semiconductor wafer, a relatively high removal rate of material is desired. With the working liquids described herein, the removal rate will typically be at least 1000 Angstroms per minute, preferably at least 2000 Angstroms per minute, more preferably at least 3000 Angstroms per minute, and most preferably at least 4000 Angstroms per minute. The removal rate of the abrasive article may vary depending upon the machine conditions and the type of wafer surface being processed. Although it is generally desirable to have a high removal rate, the removal rate preferably will not be so high as to compromise the desired surface finish and/or topography of the wafer surface or make the control of the planarization process difficult.

The surface finish of the wafer may be evaluated by known methods. One preferred method is to measure the Rt value of the wafer surface which provides a measure of "roughness" and may indicate scratches or other surface defects. See, for example, Chapter 2, RST PLUS Technical Reference Manual, Wyko Corp., Tucson, Ariz. The wafer surface is preferably modified to yield an Rt value of no greater than about 1000 Angstroms, more preferably no greater than about 100 Angstroms, and even more preferably no greater than about 50 Angstroms.

Rt is typically measured using an interferometer such as a Wyko RST PLUS Interferometer, purchased from Wyko Corp., or a TENCOR profilometer. Scratch detection may also be measured by dark field microscopy. Scratch depths may be measured by atomic force microscopy using, for example, a "Dimension 5000" scanning probe microscope available from Digital Instruments of Santa Barbara, Calif. Scratch and defect free surfaces are highly desirable.

The interface pressure between the abrasive article and wafer surface (i.e., the contact pressure) is typically less than about 30 psi, preferably less than about 15 psi, more preferably less than about 6 psi. It has been discovered that the structured abrasive article described herein, when used in the method of the invention, provides a good removal rate at an exemplified interface pressure. Also, two or more processing conditions within a planarization process may be used. For example, a first processing segment may comprise a higher interface pressure than a second processing segment. Rotation and translational speeds of the wafer and/or the abrasive article also may be varied during the planarization process.

Recessed portions of the abrasive article may act as channels to help distribute the working liquid over the entire wafer surface. The recessed portions may also act as channels to help remove the worn abrasive particles and other debris from the wafer and abrasive article interface. The recessed portions may also prevent the phenomenon known in the art as "stiction" where the abrasive article tends to stick to or become lodged against the wafer surface.

The abrasive article of the invention may be circular in shape, e.g., in the form of an abrasive disc. The outer edges of the circular abrasive disc are preferably smooth or, alternatively, may be scalloped. The abrasive article may also be in the form of an oval or of any polygonal shape such as triangular, square, rectangular, and the like. Alternatively, the abrasive article may be in the form of a belt or in the form of a roll, typically referred to in the abrasive art as abrasive tape rolls. Abrasive tape rolls may be indexed during the modification process. The abrasive article may be perforated to provide openings through the abrasive coating and/or the backing to permit the passage of the liquid medium before, during or after use.

The foregoing discussion is illustrative of suitable abrasive articles for use in conjunction with the working liquids of the present invention. Abrasive articles used in conjunction with the working liquids of the invention will generally exhibit longer usefull life in that the abrasive article generally will be able to complete at least two, preferably at least 5, more preferably at least 20, and most preferably at least 30 copper containing wafers without the necessity of being reconditioned.

The invention is further illustrated in the non-limiting examples set forth below. Unless otherwise indicated, concentrations are given as weight percentages.

EXAMPLES

The following procedures were employed in the testing referred to herein.

Procedure I

The ability of a number of polishing solutions to remove metal from a wafer surface, using a composite microstructured fixed abrasive, was determined according to this Procedure I which simulated processing a surface of a wafer. The wafer surface for this test procedure was a silicon dioxide coated silicon base wafer with a copper surface. Blanket wafers are flat and have flat and smooth metal coatings, whereas patterned wafers have features in the surface topography which are conformally coated with copper.

Copper coated blanket wafers were made from a single crystal silicon base unit having a diameter of 100 mm and a thickness of about 0.5 mm; purchased from either WaferNet or Silicon Valley Microelectronics, both of San Jose, Calif. Before deposition of the metal layer, a silicon dioxide layer approximately 5,000 Å thick was grown on the silicon wafer. A titanium adhesion/barrier layer was deposited on the silicon dioxide layer prior to metal deposition. The thickness of Ti was typically 200 Å, but may range between 100 and 300 Å. A uniform layer of Cu was then deposited over the silicon base using physical vapor deposition (PVD). The thickness of the metal layer was typically between 11,000 and 12,000 Å, and measured by an Omnimap NC110 Non-contact Metals Monitoring System, TENCOR Instruments, Prometrix Division, Santa Clara, Calif.

Copper patterned wafers were made by initially forming 10,000 Å of thermal silicon oxide, using a thermal deposition technique, on the surface of a 100 mm silicon wafer. The wafers were patterned by etching a series of 100 micron square features, by a dry etch technique, to a depth of about 7,000 Å. The wafers were then sent to WaferNet, San Jose, Calif. for a 400 Å coating of TiN on top of the dioxide and a 12,0000 Å coating of PVD copper on the TiN barrier layer.

The test machine was a modified Strasbaugh Lapping Machine, Model 6Y-1 similar to the apparatus described in FIG. 3. The wafer workpiece was rested on a foam backing available from Rodel of Newark, Del., under the designation "DF200", and the assembly was placed into a spring loaded plastic retaining ring. The abrasive article of the example was adhered to a support pad comprising a 20 mil "PCF20" polycarbonate sheet obtained from General Electric Structured Plastics, General Electric Corp., Schenectady, N.Y., laminated with a 3M adhesive 442 DL or 9671LE obtained from 3M, St. Paul, Minn., to a 90 mil ethylene vinyl acetate closed-cell foam from Voltek, Division of Sekisui America Corp., Lawrence, Mass.; the pad was affixed to the platen of the Strasbaugh.

The carrier head holding the wafer was brought into contact with an abrasive article made according to Procedure III herein. The wafer was rotated at about either 40 or 60 rpm and the platen was rotated at the same speed as the carrier head. Both the wafer and the abrasive article rotated in a clockwise manner. In addition to rotating, the wafer moved through an arc (approximately 31 mm with a 9 second periodicity) starting about 13 mm from the edge of the abrasive article. The platen was 12 inches in diameter. The abrasive article and carrier head were brought into contact with one another at a downforce of about 350 KPa (50 pounds) unless otherwise specified. The working liquid was pumped onto the abrasive article before contacting the wafer. During polishing, the working liquids were pumped onto the wafer and abrasive interface at a flow rate of about 40 ml/minute. The abrasive article was used to polish the blanket wafers for a one minute (60 second) cycle. After the polishing cycle, the wafer was removed from the holder and rinsed with deionized water.

The metal removal rate was calculated by determining the change in metal film thickness. The initial (i.e., before polishing) and final (i.e., after polishing) measurements were taken at the same locations on the NC110. Five readings were averaged to determine the removal rate in Angstroms per minute (Å/min). Blanket metal coated wafers are used to determine metal film thickness removal rates.

Patterned wafers were used for determining the extent of dishing. When 100 micron square features were exposed during polishing, the features on the wafer were measured to determine the extent of dishing in areas on the surface from which had copper removed to expose the silicon dioxide stop layer or the barrier layer metal stop layer. A TENCOR P-22 Automated Surface Profilometer, TENCOR Instruments, Santa Clara, Calif. was used to measure the dishing.

Procedure II

The ability of a number of polishing solutions to remove metal from a wafer surface, using a composite microstructured fixed abrasive, was determined according to this Procedure II. The wafer surface for this test procedure was a silicon dioxide coated silicon base blanket wafer with a copper surface. Blanket wafers are flat and have flat and smooth metal coatings, whereas patterned wafers have features in the surface topography which are conformally coated with copper.

The copper coated blanket wafers were made from a single crystal silicon base unit having a diameter of 200 mm and a thickness of about 0.5 mm; purchased from WaferNet of San Jose, Calif. Deposition of layers on the silicon wafers was carried out by WaferNet. Before deposition of the metal layer, a silicon dioxide layer was grown on the silicon wafer. This layer was approximately 5,000 Å thick. A titanium adhesion layer was deposited on the silicon dioxide layer prior to barrier layer metal deposition. The thickness of Ti was specified to be 200 Å. A titanium nitride (TiN) barrier layer was deposited on the Ti layer prior to metal deposition. The thickness of TiN was also specified to be 200 Å. A uniform layer of Cu was then deposited over the silicon base using physical vapor deposition (PVD). The thickness of the metal layer was typically between 11,000 and 12,000 Å, and measured by an Omnimap NC110 Non-contact Metals Monitoring System, TENCOR Instruments, Prometrix Division, Santa Clara, Calif.

The 200 mm diameter copper patterned wafers were purchased from SKW Associates, Los Altos, Calif. The patterned wafers are specified as Copper Damascene CMP Characterization Wafer: SKW 6-1. The wafers are single crystal silicon coated with the following layers in order: 8000 Å silicon dioxide deposited from plasma enhanced tetraethylorthosilicate (PETEOS), 500 Å Tantalum (Ta) barrier layer, 500 Å copper seed layer, and 15,000 Å electroplated copper. The pattern etched in the silicon dioxide, to a depth of about 8,000 Å, includes arrays of 120 micron square bond pads which were used for dishing measurements.

The test machine was a Westech Systems, Inc Model 372-01001 Automatic Wafer Polisher, Phoenix, Ariz., similar to the apparatus described in FIG. 3. The wafer workpiece was rested on a foam backing available from Rodel of Newark, Del., under the designation "DF200" in the carrier bead. The abrasive article of the example was adhered to a support pad comprising a 20 mil "PCF20" polycarbonate sheet obtained from General Electric Structured Plastics, General Electric Corp., Schenectady, N.Y., laminated with a 3M adhesive 442 DL or 9671LE obtained from 3M, St. Paul, Minn., to a 90 mil ethylene vinyl acetate closed-cell foam from Voltek, Division of Sekisui America Corp., Lawrence, Mass.; the pad was affixed to the platen of the Westech 372.

The carrier head holding the wafer was brought into contact with an abrasive article prepared according to Procedure III herein. The wafer was rotated at about either 20 or 30 or 40 rpm and the platen was rotated at the same speed as the carrier head plus one, either 21 or 31 or 41 rpm. Both the wafer and the abrasive article were rotated in a clockwise manner. The platen was 22.5 inches in diameter. In addition to rotating, the wafer carrier was oscillated through an arc (approximately 48 mm long at a rate of 10 mm/sec) starting about 13 mm from the edge of the abrasive article. The abrasive article and carrier head were brought into contact with one another at a downforce of 0.7 pounds per square inch psi for 10 sec. and then the pressure rapidly, over about 10 seconds, ramped up to 3 or 4 (psi) as specified in the examples. The working liquids were pumped onto the abrasive article before contacting the wafer. During polishing, working liquids were pumped onto the wafer and abrasive interface at a flow rate of about 225 ml/minute. The abrasive article was used to polish the blanket wafers for a one minute (60 second) cycle. After the 60 sec polishing cycle, the pressure was reduced for 5 sec and then the wafer was unloaded from the holder and rinsed with deionized water.

The metal removal rate was calculated by determining the change in metal film thickness. The initial (i.e., before polishing) and final (i.e., after polishing) measurements were taken at the same locations using an NC110. Forty-nine readings were averaged to determine the removal rate in Angstroms per minute (Å/min). Blanket metal coated wafers are used to determine metal film thickness removal rates.

Patterned wafers are used for determining the extent of dishing. When the 120 micron square features are exposed during polishing, the features on the wafer were measured to determine the extent of dishing in areas on the surface which had copper removed to expose the silicon dioxide stop layer or the barrier layer metal stop layer. The TENCOR P-22 Automated Surface Profilometer, TENCOR Instruments, Santa Clara, Calif. was used to measure the dishing.

Procedure III (General Procedure for Making Abrasive Articles)

The material designations below are used in describing the preparation of abrasive articles.

Material Designations

| Designation | Material |
|---|---|
| SR339 | 2-phenoxy ethyl acrylate, commercially available from Sartomer Co., Inc., under the trade designation "Sartomer SR339" |
| SR9003 | Propoxylated neopentyl glycol diacrylate from Sartomer |

-continued

Material Designations

| Designation | Material |
|---|---|
| LR8893 | 2,4,6-trimethylbenzoyl-diphenyl-phosphine oxide liquid photoinitiator, commercially available from BASF, Charlotte, NC under the trade designation "LUCIRIN LR8893" |
| DISPERBYK 111 | A dispersing agent, commercially available from Byk Chemie, Wallingford, CT under the trade designation "DISPERBYK 111" |
| TRS2039 | Mostly alpha alumina particles having an average particle size of about 0.2 micron, obtained from Ferro Corporation, Penn Yan, NY |

Abrasive articles used in the Examples were prepared as follows:

A polypropylene production tool was made by casting polypropylene material on a metal master tool having a casting surface comprised of a collection of adjacent cylindrical posts. The cylindrical pattern was such that adjacent bases were disposed in a triangular array with an intra-post spacing selected to provide the desired apparent bearing area. The resulting production tool contained cylindrical cavities.

The 200-18 micron post pattern is a triangular array of cylindrical posts, the posts having a diameter of 200 microns, a height of 40 microns, and a center to center spacing of 486 microns. The 200-25 micron post pattern is a triangular array of cylindrical posts, the posts having a diameter of 200 microns, a height of 56 microns, and a center to center spacing of 373 microns.

The production tool was secured to a metal carrier plate using a masking type pressure sensitive adhesive tape. An abrasive slurry, consisting of 9.99% SR 9003; 14.99% SR 339; 2.51% Dysperbyk 111; 0.80% LR8893 X; and 71.71% TRS 2093 was mixed using a high shear mixer until homogenous. The abrasive slurry was then filtered sequentially through an 80 $\mu$m filter and a 60 $\mu$m filter. This abrasive slurry was then coated into the cavities of the production tool using a squeegee following which a 5 mil polyester film from DuPont, Melinex 61, was brought into contact with the abrasive slurry contained in the cavities of the production tool. The article was then passed through a bench top laboratory laminator, commercially available from Chem Instruments, Model #001998. The article was continuously fed between the two rubber rollers at a pressure between about 280–560 Pa (40–80 psi) and a speed setting of approximately 2 to 7. A quartz plate was placed over the article. The article was cured by passing the tool together with the backing and abrasive slurry under either two iron doped lamps, commercially available from American Ultraviolet Company or two ultraviolet ("V") bulbs, commercially available from Fusion Systems, Inc., both which operated at about 157.5 Watts/cm (400 Watts/inch). The radiation passed through the film backing. The speed was between about 10.2–13.7 meters/minute (15–45 feet/minute) and the sample was passed through up to two times.

Procedure IV (Working Liquids)

Working liquids were prepared using semiconductor grade hydrogen peroxide obtained from Olin Corp. (Norwalk, Conn.) as 30% solutions and diluted as necessary. Ammonium hydrogen phosphate (ACS reagent grade), iminodiacetic acid, ammonium citrate, tolyltriazole(5-methyl-1-H-benzotriazole), and 1-H-benzotriazole were obtained from Aldrich Chemical Company, Milwaukee, Wis.

All solutions used deionized water. Solids were weighed out separately and dissolved in water with 30% hydrogen peroxide added last to give the proper dilution. For the following examples all solutions have 3.0% ammonium hydrogen phosphate and 3.3% hydrogen peroxide. The chelating agent, iminodiacetic acid or ammonium citrate differ and the passivating agent, tolyltriazole or benzotriazole differ for the different examples. The balance of each solution was deionized water.

Reagents and amounts are as follows for lab scale preparation with 3.3% hydrogen peroxide, 3.0% ammonium hydrogen phosphate, 1.0% iminodiacetic acid and 0.05% tolyltriazole:

| Total Solution | 1000 g (~1 L) |
|---|---|
| Reagents (ACS Reagent grade) | |
| (1) ammonium hydrogen phosphate (s) | 30 g |
| (2) iminodiacetic acid (s) | 10.0 g |
| (3) tolyltriazole (s) | 0.50 g |
| (4) water (l) | 849.5 g |
| (5) 30% hydrogen peroxide (d = 1.1), (l) | 110 g (100 mL) |

Comparative Example A

Procedure I was used test abrasive articles as are described herein except that, for the patterned wafer, the adhesion/barrier layer was 200 Å Ti; the copper coating was about 10,000 Å; and the etch depth for the bond pads was about 5,000 Å. The platen speed was 67 rpm; the carrier speed was 100 rpm and the flow rate was 80 ml/min. An abrasive article, prepared according to Procedure III herein, was used having a post pattern of 200-25.

A working liquid was prepared according to the Procedure IV herein having 0.50% ammonium citrate as the chelating agent and 0.10% benzotriazole as the passivating agent. The solution was tested according to Procedure I. Significant areas of the wafer had copper and titanium removed from the surface of the wafer, exposing the silicon dioxide stop layer except in the etched 100 micron square features and other etched features. The profile of the 100 micron square features on the wafer were measured to determine the extent of dishing in areas which had copper removed to expose the silicon dioxide stop layer. A TENCOR P-22 Profilometer was used to measure the dishing. Four different sites on the wafer were measured. The measurements are reported in Table 1.

TABLE 1

| Site | Dishing (TIR, Å) |
|---|---|
| 1 | 1990 |
| 2 | 1880 |
| 3 | 1390 |
| 4 | 1080 |

Comparative Example B

Procedure II was used except that the adhesion/barrier layer was TiN at a thickness of about 300 to 600 Å; the bond pads were 100 micron square, the trenches were etched to about 5,000 Å, and the copper was about 12,000 Å thick. The wafers were manufactured in a fashion similar to, but not necessarily the same as the wafers from SKW Associates. The patterned wafers were prepared for evaluating the copper Damascene CMP process.

An abrasive article prepared according to Procedure III herein was used having a post pattern of 200-25. A working liquid was prepared according to Procedure IV herein with 0.50% ammonium citrate as the chelating agent and 0.10% tolyltriazole as the passivating agent. The working liquid was tested according to Procedure II with The pressure on the wafer set at 4 psi with 1 psi back pressure. Platen and carrier speeds were 30 and 31 rpm, respectively. The removal rates for a 1 minute polish on the first two blanket wafers were 3928 and 4159 Å/min with uniformity around 35–40%. The removal rate for a 1 minute polish on a blanket wafer run preceding the patterned wafer was 3658 Å/min. The patterned wafer was run for 2.0 minutes under the same conditions and the approximate removal rate checked; the uniformity profile was center slow, so the final 2 minutes of polish were done with 3 psi back pressure. The wafer was substantially cleared toward the outside of the wafer, but copper remained in the center with about a 4 inch diameter. A TENCOR P-22 Profilometer was used to measure the dishing. Four different sites on the wafer were measured. The measurements are reported in Table 2.

TABLE 2

| Site | Dishing (TIR, Å) |
|---|---|
| 1 | 500 |
| 2 | 1200 |
| 3 | 1600 |
| 4 | 2100 |

Example 1

An abrasive article was prepared according to Procedure III herein having a post pattern of 200-18. A working liquid was prepared according to Procedure IV herein with 1.0% iminodiacetic acid as the chelating agent and 0.10% benzotriazole as the passivating agent. The chemistry of the working liquid was tested according to Procedure I except that the platen and carrier speeds were 40 rpm. A blanket wafer, polished for 1 minute, and preceding the patterned wafer, had a removal rate of 388 Å/min, which is typically too low to be considered useful. The patterned wafer started to clear at the very edge after 12 minutes and was checked subsequently every two minutes. Pattern features started to clear around the outside of the wafer after about 18 minutes. After 23 minutes a small copper circle remained in the center and the barrier layer was cleared from the outside. The polish was completed after 25 minutes down to the barrier layer stop near the center portion of the wafer and down to the oxide stop near the outside of the wafer. A TENCOR P-22 Profilometer was used to measure the dishing. Nine different sites on the wafer were measured. The measurements are reported in Table 3.

TABLE 3

| Site | Location | Dishing (TIR, Å) |
|---|---|---|
| 1 | Edge | 540 |
| 2 | Edge | 800 |
| 3 | Edge | 800 |
| 4 | Edge | 850 |
| 5 | Inner | 410 |
| 6 | Inner | 500 |
| 7 | Inner | 520 |
| 8 | Inner | 520 |
| 9 | Center | 500 |

Example 2

An abrasive article was made according to Procedure III herein and having a post pattern of 200-25. A working liquid was prepared according to Procedure IV herein with 10% iminodiacetic acid as the chelating agent and 0.05% tolyltriazole as the passivating agent. The chemistry of the working liquid was tested according to Procedure I with platen and carrier speeds at 60 rpm. The removal rate determined on a blanket wafer preceding the patterned wafer was 1700 Å/min. The patterned wafer was polished for 5.0 minutes and had a blanket appearance. The patterned wafer was put back on the polisher and polished for 2.0 minutes. After the 7 total minutes, the wafer was completely cleared to the TiN barrier layer. The barrier layer did not have a uniform color indicating that it may have been partially removed. A TENCOR P-22 Profilometer was used to measure the dishing. Nine different sites on the wafer were measured. The measurements are reported in Table 4.

TABLE 4

| Site | Dishing (TIR, Å) |
| --- | --- |
| 1 | 350 |
| 2 | 550 |
| 3 | 570 |
| 4 | 580 |
| 5 | 600 |
| 6 | 600 |
| 7 | 600 |
| 8 | 610 |
| 9 | 620 |

Example 3

An abrasive article was prepared according to Procedure III herein having a post pattern of 200-18. A working liquid was prepared according to Procedure IV herein with 1.0% iminodiacetic acid as the chelating agent and 0.05% tolyltriazole as the passivating agent. The performance of the working liquid was tested according to Procedure I. The platen and carrier speeds were 40 rpm. The removal rate determined on a blanket wafer preceding the patterned wafer was 1755 Å/min. The patterned wafer was polished for 6.0 minutes and was cleared about 60 to 70% in the center of the wafer. The wafer was put back on the polisher and polished for 30 more seconds to essentially clear the whole wafer to the TiN barrier layer except for one small area. The wafer was then measured for dishing on the TENCOR P-22. The nine sites examined are on two perpendicular diameters which span the wafer. The four edge sites would be considered just cleared while the five inner sites would be considered to have 30 seconds of overpolish. The dishing values are listed in column 3 of Table 5 below. The patterned wafer was observed in a bright field optical microscope for barrier layer removal. The barrier layer was partially removed in the areas of the wafer where the density of copper-filled trenches was high, but not in the areas where no pattern was found.

In a separate experiment on a different day with a new abrasive article and a new batch of chemistry, but under the same conditions, the same patterned wafer was polished again to observe whether or not the TiN layer could be removed. The patterned wafer was polished for 1.0 minutes and then 30 sec more. After the first additional minute the barrier layer was removed to the silicon dioxide stop as indicated by the uniform color of the wafer, except for the small area which had just cleared of copper. The barrier layer removal was confirmed in the optical microscope. The last 30 sec removed most of the remaining barrier at the last copper site cleared. The dishing was measured again on a TENCOR P-22 at the corresponding sites, but not the exact same set of bond pads at that site. The dishing values are listed in the last column in Table 5.

TABLE 5

| Site | Location | Dishing (TIR, Å) | Dishing after 1.5 min overpolish (Å) |
| --- | --- | --- | --- |
| 1 | Edge | Not cleared | 600 |
| 2 | Edge | 340 | 700 |
| 3 | Edge | 700 | 820 |
| 4 | Edge | 750 | 700 |
| 5 | Inner | 750 | 950 |
| 6 | Inner | 800 | 1000 |
| 7 | Center | 800 | 980 |
| 8 | Inner | 850 | 1030 |
| 9 | Inner | 900 | 1100 |

Example 4

An abrasive article was prepared according to Procedure III herein with a post pattern of 200-18. A working liquid was prepared according to Procedure IV herein with 1.0% iminodiacetic acid as the chelating agent and 0.05% tolyltriazole as the passivating agent. The chemistry of the working liquid was tested according to Procedure II with no back pressure on the wafers. The first blanket rate wafer was run at 3 psi with platen and carrier speeds of 40 and 41, respectively; the removal rate was 2679 Å/min with a uniformity of 5.84%. The second blanket rate wafer was run at 4 psi with platen and carrier speeds of 40 and 41, respectively; the removal rate was 2638 Å/min with a uniformity of 4.46%. The third blanket rate wafer was run at 3 psi with platen and carrier speeds of 60 and 61, respectively; the removal rate was 2547 Å/min with a uniformity of 3.42%. The patterned wafer was run at 3 psi with platen and carrier speeds of 40 and 41 for 4 minutes (not yet cleared) plus 2.5 minutes when it was substantially cleared down to the tantalum stop. The TENCOR P-22 Profilometer was used to measure the dishing. Three different sites on the wafer were measured and are reported in Table 6.

TABLE 6

| Site | Dishing (TIR, Å) | Approximate location |
| --- | --- | --- |
| 1 | 550 | Edge |
| 2 | 650 | Center |
| 3 | 890 | Midway between center and edge |

The patterned wafer was then replaced in the polisher and polished for 30 more seconds under the same conditions. This polish removed the last traces of copper on the tantalum stop and is considered to be overpolished. Table 7 contains the same data plus additional data collected from a TENCOR P-22. The sites examined after overpolishing were not the same sites measured previously. The sites midway between center and edge were from 3 different radii from the center of the wafer, 90 degrees from each other.

TABLE 7

| Site | Dishing (TIR, Å) | Approximate location | Over polish dishing (Å) |
| --- | --- | --- | --- |
| 1 | 550 | Edge | 520 |
| 2 | 650 | Center | 750 |
| 3 | 890 | Midway between center and edge | 1050 |
| 4 | — | Midway between center and edge | 1000 |
| 5 | — | Midway between center and edge | 700 |

The foregoing Examples exhibit a narrow range of dishing values. The inventive working liquids used in the foregoing Examples provide dishing values for copper significantly lower than dishing values obtained with the working liquids utilized in the Comparative Examples A and B. Furthermore, the level of additional dishing is lower for the structured wafers in the Examples when the wafers are polished for an additional time after the wafer has been substantially cleared of copper (overpolishing). The level of additional dishing on overpolishing can be significant when uniformity is not very good and some portions of the wafer are cleared while other portions still have copper to be removed, thus requiring further polishing of the whole wafer. In the Comparative Examples, the copper bond pads with the greatest dishing numbers (deepest) are assumed to have been cleared first and then deepened with overpolishing while the remaining bond pads were being cleared. Although the dishing values in the Examples range from about 400 to about 1000 Å, depending on the example, those trained in the art may be able to significantly improve the dishing values through process optimization on state-of-the-art polishing equipment.

Additionally, the results for inventive Examples 2–4 indicate an improvement in the material removal rate as compared with Example 1. It is believed that this noted improvement in performance is due to a synergy between the IDA and tolyltriazole components in the working liquid. In the working liquid of Example 1, the passivating agent was benzotriazole with a noted diminution in the removal rate for this working liquid.

While a preferred embodiment of the invention has been described in detail, it will be appreciated that changes to the described embodiment may be made to those skilled in the art without departing from the spirit of the invention.

What is claimed is:

1. A working liquid useful in modifying a surface of a wafer suited for fabrication of a semiconductor device, the liquid being a solution of initial components, the components comprising:

an oxidizing agent;

an ionic buffer;

a passivating agent;

a chelating agent selected from iminodiacetic acid and salts thereof; and water.

2. The working liquid of claim 1 wherein the passivating agent is selected from the group consisting of benzotriazole, tolyltriazole and combinations thereof.

3. The working liquid of claim 1 wherein the oxidizing agent is hydrogen peroxide; the ionic buffer is ammonium hydrogen phosphate; and, the passivating agent is selected from the group consisting of benzotriazole, tolyltriazole and combinations thereof.

4. The working liquid according to claim 3 wherein hydrogen peroxide is present in the liquid at a concentration between about 0.5 and about 12.5 weight percent; ammonium hydrogen phosphate is present in the liquid at a concentration between about 1.0 and about 8.0 weight percent; the passivating agent is present in the liquid at a concentration between about 0.025 and about 0.20 weight percent; the chelating agent is present in the liquid at a concentration between about 0.5 and about 5.0 weight percent; and the balance is water.

5. A working liquid useful in modifying a surface of a wafer suited for fabrication of a semiconductor device, the liquid being a solution of components, the components comprising:

between about 0.5 wt % and 12.5 wt % hydrogen peroxide;

between about 1.0 and about 8.0 weight percent ammonium hydrogen phosphate;

between about 0.025 and 0.20 weight percent of a passivating agent selected from benzotriazole, tolyltriazole and combinations thereof;

between about 0.5 and 5.0 weight percent of a chelating agent selected from iminodiacetic acid and salts thereof; and balance, water.

6. A method of modifying a surface of a wafer suited for fabrication of a semiconductor device comprising the steps of:

a) providing a wafer comprising a first material having a surface etched to form a pattern and a second material deployed over the surface of the first material;

b) contacting the second material of the wafer with abrasive in the presence of the working liquid of claim 1; and c) relatively moving the wafer while the second material is in contact with the abrasive until an exposed surface of the wafer is planar and comprises at least one area of exposed first material and one area of exposed second material.

7. The method of claim 6 wherein the passivating agent is selected from the group consisting of benzotriazole, tolyltriazole and combinations thereof.

8. The method of claim 6 wherein the oxidizing agent is hydrogen peroxide; the ionic buffer is ammonium hydrogen phosphate; and, the passivating agent is selected from the group consisting of benzotriazole, tolyltriazole and combinations thereof.

9. The method of claim 8 wherein hydrogen peroxide is present in the liquid at a concentration between about 1.0 and about 5.0 weight percent; ammonium hydrogen phosphate is present in the liquid at a concentration between about 1.0 and about 8.0 weight percent; the passivating agent is present in the liquid at a concentration between about 0.050 and about 0.10 weight percent; the chelating agent is present in the liquid at a concentration between about 0.75 and about 1.5 weight percent; and the balance is water.

10. The method of claim 6 wherein the abrasive comprises three-dimensional abrasive composites fixed to an abrasive article, the composites comprising a plurality of abrasive particles fixed and dispersed in a binder.

11. The method of claim 10, wherein the abrasive article is supported on a subpad.

12. The method of claim 11, wherein the subpad is a laminate of a polycarbonate sheet and polyurethane foam.

13. The method of claim 6 wherein the abrasive comprises a slurry and a polishing pad, the slurry comprising a plurality of loose abrasive particles dispersed in a liquid, the slurry contacting the second material of the wafer by the application of the polishing pad.

14. The method of claim 13 wherein the slurry contains the working liquid.

15. The method of claim 6 wherein the first material is a dielectric material and the second material is a conductive material.

16. The method of claim 6, wherein the wafer further comprises an barrier layer covering the dielectric material.

17. The method of claim 6, wherein the second material is a conductive material selected from the group consisting of titanium, silver, aluminum, tungsten, copper, or alloys thereof.

18. A polishing slurry comprising:
abrasive particles;
an oxidizing agent;
an ionic buffer;
a passivating agent;
a dispersing agent;
a chelating agent selected from iminodiacetic acid and salts thereof; and
water.

* * * * *